US006316307B1

(12) United States Patent
Lee et al.

(10) Patent No.: US 6,316,307 B1
(45) Date of Patent: Nov. 13, 2001

(54) METHOD OF FORMING A CAPACITOR FOR A SEMICONDUCTOR MEMORY DEVICE

(75) Inventors: Kee Jeung Lee, Seoul; Kwang Chul Joo, Kyoungki-do, both of (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/608,891

(22) Filed: Jun. 30, 2000

(30) Foreign Application Priority Data

Jan. 7, 1999 (KR) .................................. 99-26404

(51) Int. Cl.[7] .............................................. H01L 21/8242
(52) U.S. Cl. ...................... 438/239; 438/240; 438/241; 438/242; 438/243; 438/785; 438/786; 438/778
(58) Field of Search ................... 438/239, 240, 438/241, 243, 785, 786, 778

(56) References Cited

U.S. PATENT DOCUMENTS

| 4,130,694 | 12/1978 | Glass et al. |
| 5,248,629 | * 9/1993 | Muroyama . |

(List continued on next page.)

FOREIGN PATENT DOCUMENTS

| 0877410A1 | 11/1998 | (EP) . |
| 62136035 | 6/1987 | (JP) . |
| 63038248 | 2/1988 | (JP) . |
| 01173622 | 7/1989 | (JP) . |
| 02226754 | 9/1990 | (JP) . |
| 05167008 | 7/1993 | (JP) . |
| 05335483 | 12/1993 | (JP) . |
| 06163819 | 6/1994 | (JP) . |
| 07014993 | 1/1995 | (JP) . |
| 07045467 | 2/1995 | (JP) . |
| 11191612 | 7/1999 | (JP) . |
| 11233723 | 8/1999 | (JP) . |

Primary Examiner—Matthew Smith
Assistant Examiner—V. Yevsikov
(74) Attorney, Agent, or Firm—Pillsbury Winthrop LLP (57) ABSTRACT

Disclosed is a method of forming a capacitor for a semiconductor memory device according to the present invention. The method includes the steps of: forming a lower electrode on a semiconductor substrate; performing a surface-treatment process to prevent a natural oxide layer from generating on the surface of the lower electrode; forming a TaON layer on the upper part of the surface-treated lower electrode by a reaction of Ta chemical vapor, $O_2$ gas and $NH_3$ gas; crystallizing the TaON layer; and forming an upper electrode on the upper part of the TaON layer, wherein the TaON layer is formed in a low pressure chemical vapor deposition (LPCVD) chamber equipped with a shower head injecting Ta chemical vapor, $O_2$ gas and $NH_3$ gas on an upper part thereof and at a temperature of 300 to 600° C. with pressure of 0.1 to 10 Torr; wherein the TaON layer is formed in the LPCVD chamber that a first injector to which Ta chemical vapor and $O_2$ gas are injected and formed at one side-wall of the TaON layer and a second injector to which $NH_3$ gas is injected and formed at the other side-wall opposed to the first injector, thereby injecting reaction gases in a counter-flow state, and the TaON layer is formed at a temperature of 300 to 600° C. with pressure of 0.1 to 10 Torr; wherein the TaON layer is formed in the LPCVD chamber that a first injector to which Ta chemical vapor and $O_2$ gas are injected and formed at one side-wall of the TaON layer and a second injector to which $NH_3$ gas is injected and formed at the other side-wall opposed to the first injector, thereby injecting reaction gases in a counter-flow state, and the TaON layer is formed at a temperature of 300 to 600° C. with pressure of 0.1 to 10 Torr.

36 Claims, 5 Drawing Sheets

U.S. PATENT DOCUMENTS

| | | |
|---|---|---|
| 5,352,623 | 10/1994 | Kamiyama . |
| 5,452,178 | 9/1995 | Emesh et al. . |
| 5,631,188 | 5/1997 | Chang et al. . |
| 5,677,015 | 10/1997 | Hasegawa . |
| 5,685,968 * | 11/1997 | Hayakawa et al. .................. 205/122 |
| 5,741,721 | 4/1998 | Stevens . |
| 5,753,945 | 5/1998 | Chivukula et al. . |
| 5,763,300 | 6/1998 | Park et al. . |
| 5,776,660 | 7/1998 | Hakey et al. . |
| 5,837,576 | 11/1998 | Chen et al. . |
| 5,859,760 | 1/1999 | Park et al. . |
| 5,872,415 | 2/1999 | Dreifus et al. . |
| 5,872,696 * | 2/1999 | Peters et al. ......................... 361/305 |
| 5,910,880 | 6/1999 | DeBoer et al. . |
| 5,936,831 | 8/1999 | Kola et al. . |
| 5,977,582 | 11/1999 | Fleming et al. . |
| 5,980,977 | 11/1999 | Deng et al. . |
| 6,201,276 * | 3/2001 | Agarwall et al. .................... 257/315 |

* cited by examiner

METHOD OF FORMING A CAPACITOR FOR A SEMICONDUCTOR MEMORY DEVICE

FIELD OF THE INVENTION

The present invention relates to a method of forming a capacitor for a semiconductor memory device, and more particularly to a method forming a capacitor for a semiconductor memory device using a TaON layer as a dielectric.

BACKGROUND OF THE INVENTION

Along with the recent progress in the semiconductor manufacturing technology, the demand for memory device has increased dramatically. Consequently, a memory device having high capacitance in comparison with narrow area is required. Capacitance of the capacitor is increased by using an insulator having high dielectric constant or enlarging the surface area of a lower electrode. Those conventional capacitors have used a tantalum-oxide($Ta_2O_5$) layer having a dielectric constant higher than that of a nitride-oxide (NO) layer as a dielectric, thereby forming the lower electrode having 3-Dimensional structure.

Figure 1:
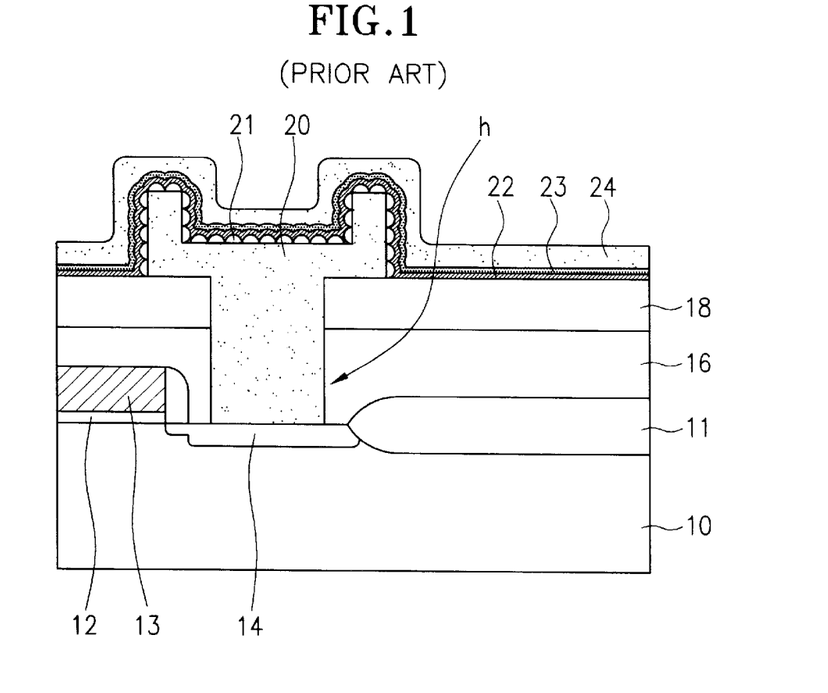
FIG. 1 is a cross-sectional view showing a conventional capacitor for semiconductor device.

FIG. 1 is a cross-sectional view showing a capacitor for a conventional semiconductor memory device. Referring to FIG. 1, a gate electrode 13 including a gate insulating layer 12 at a lower portion thereof is formed by a known technology on the upper part of a semiconductor substrate 10 which a field oxide layer is formed at a selected portion thereof. A junction region 14 is formed on the semiconductor substrate 10 at both sides of the gate electrode 13, thereby forming an MOS transistor. A first interlevel insulating layer 16 and a second interlevel insulating layer 18 are formed on the upper part of the semiconductor substrate 10 which the MOS transistor is formed thereon. A storage-node contact hole h is formed in the first and the second interlevel insulating layers 16 and 18 so that the junction region 14 is exposed. A cylinder type lower electrode 20 is formed by a known technology in the storage-node contact hole h to be contacted with the exposed junction region 14. A hemi-Spherical grain(HSG) layer 21 is formed on the surface of the lower electrode 20 in order to increase the surface area of the lower substrate 20. A $Ta_2O_5$ layer 23 is formed on the surface of the HSG layer 21. At this time, the $Ta_2O_5$ layer 23 is formed as follows. First, a surface of the HSG layer 21 is cleaned before the $Ta_2O_5$ layer 23 is formed, and then the RTN(rapid thermal nitration) process is performed ex situ, thereby forming a silicon-nitride layer 22 on the surface of the HSG layer 21. Next, a first $Ta_2O_5$ layer is formed at temperature of approximately 400~450° C. to the thickness of 53~57 Å. Afterward, an annealing process is performed at low temperature, and a second $Ta_2O_5$ layer is formed to the same thickness and by the same process as in the first $Ta_2O_5$ layer. Annealing processes at low temperature and at high temperature are continued in series, thereby forming a single $Ta_2O_5$ layer 23. An upper electrode 24 is deposited on upper parts of the $Ta_2O_5$ layer 23 and the second interlevel insulating layer 18, thereby completing the formation of a capacitor.

However, the conventional capacitor formed according to the above method using the $Ta_2O_5$ as a dielectric has the following problems.

First, a difference in the composition rate of Ta and O is generated since a general $Ta_2O_5$ layer has unstable stoichiometry. As a result, substitutional Ta atoms, i.e. vacancy atoms, are generated in a thin film. Since those vacancy atoms are oxygen vacancies, leakage current is generated. The amount of vacancy atoms can be controlled depending on the contents and the bonding strength of components in the $Ta_2O_5$ layer; however, it is difficult to eliminate them completely.

The $Ta_2O_5$ layer is oxidized so as to remove the substitutional Ta atoms therein in order to stabilize the unstable stoichiometry thereof. However, when the when the $Ta_2O_5$ layer is oxidized to prevent leakage current, the following problems are generated. That is, the $Ta_2O_5$ layer has high oxide reaction with the upper and the lower electrodes formed of polysilicon or TiN and so forth. Therefore, in a process oxidizing the substitutional Ta atoms, an oxide layer having low dielectric constant is formed at an interface since the $Ta_2O_5$ layer and the upper electrode or the lower electrode react to one another, and oxygen moves to the interface between the $Ta_2O_5$ layer and the lower electrode, thereby deteriorating the homogeneity thereof.

Further, due to the reaction between an organic substance such as $Ta(OC_2H_5)_5$ used as a precursor and $O_2$(or $N_2O$) gas, impurities such as carbon atoms C, carbon compounds ($CH_4$, $C_2H_4$) and $H_2O$ are generated in the $Ta_2O_5$ layer. These impurities increase leakage current in the capacitor and deteriorate the dielectric characteristics of the $Ta_2O_5$ layer. Accordingly, a capacitor having a large capacitance is difficult to obtain.

Moreover, in a method of using a tantalum oxide layer as a dielectric layer, before the formation of the tantalum oxide layer and after the cleaning process, extra ex-situ process is performed, the tantalum oxide layer is deposited in two steps, and two times of thermal processes are performed at low and high temperatures after the formation of the tantalum oxide layer. Therefore, a manufacturing process is cumbersome.

SUMMARY OF THE INVENTION

Accordingly, it is one object of the present invention to provide a method of forming a capacitor for a semiconductor device capable of ensuring a great capacitance by providing a dielectric layer having low leakage current and high dielectric constant.

To achieve the object of the present invention, the present invention provides a method of forming a capacitor for a semiconductor memory device comprising the steps of: forming a lower electrode on a semiconductor substrate; performing a surface-treatment process to prevent a natural oxide layer from generating on the surface of the lower electrode; forming a TaON layer on the upper part of the surface-treated lower electrode by a reaction of Ta chemical vapor, $O_2$ gas and $NH_3$ gas; crystallizing the TaON layer; and forming an upper electrode on the upper part of the TaON layer, wherein the TaON layer is formed in a low pressure chemical vapor deposition(LPCVD) chamber equipped with a shower head injecting Ta chemical vapor, $O_2$ gas and $NH_3$ gas on an upper part thereof and at a temperature of 300 to 600° C. with pressure of 0.1 to 10 Torr.

Moreover, according to another embodiment of the present invention, the present invention provides a method of forming a capacitor for a semiconductor memory device comprising the steps of: forming a lower electrode on the semiconductor substrate; performing a surface-treatment process to prevent a natural oxide layer from generating on the surface of the lower electrode; forming a TaON layer on the upper part of the surface-treated lower electrode by a reaction of Ta chemical vapor, $O_2$ gas and $NH_3$ gas; crystallizing the TaON layer; and forming an upper electrode on the upper part of the TaON layer, wherein the TaON layer is formed in an LPCVD chamber that a first injector to which Ta chemical vapor and $O_2$ gas are injected and formed at one side-wall of the chamber and a second injector to which $NH_3$ gas is injected and formed at the other side-wall opposed to the first injector, thereby injecting reaction gases in a counter-flow state, and the TaON layer is formed at a temperature of 300 to 600° C. with pressure of 0.1 to 10 Torr.

Further, the present invention further provides a method of manufacturing a capacitor for a semiconductor memory device comprising steps of: forming a lower electrode on the semiconductor substrate; performing a surface-treatment process to prevent a natural oxide layer from generating on the surface of the lower electrode; forming a TaON layer on the upper part of the surface-treated lower electrode by a reaction of Ta chemical vapor, $O_2$ gas and $NH_3$ gas; crystallizing the TaON layer; and forming an upper electrode on the upper part of the TaON layer, wherein the TaON layer is formed in an LPCVD chamber by providing a first injector injecting Ta chemical vapor and $O_2$ gas and a second injector injecting $NH_3$ gas at both sides of lower portion thereof respectively, thereby injecting the reaction gases in a parabola form, and the TaON layer is formed at a temperature of 300 to 600° C. with pressure of 0.1 to 10 Torr.

DETAILED DESCRIPTION OF THE PREFERRED EMBODIMENTS

[Embodiment 1]

Figure 2A:
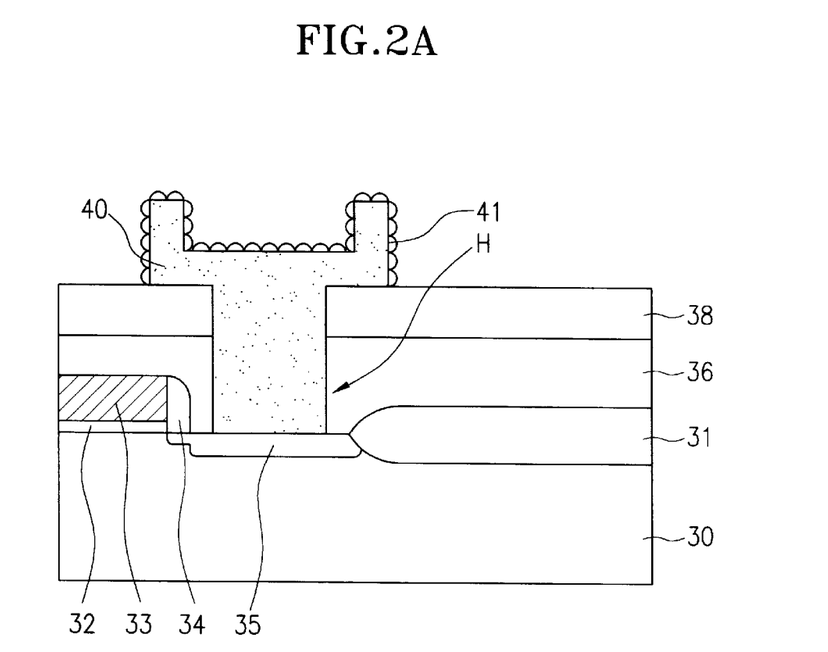
FIGS. 2A to 2C are cross-sectional views for illustrating a capacitor for a semiconductor device according to a first embodiment of the present invention.

Referring to FIG. 2A, a field oxide layer 31 is formed according to a known method at a selected portion of a semiconductor substrate 30 having a selected conductivity. A gate electrode 33 having a gate insulating layer 32 at a lower portion thereof is formed at a selected portion on the upper part of the semiconductor substrate 30, and a spacer 34 is formed according to a known method at both side-walls of the gate electrode 33. A junction region 35 is formed at the semiconductor substrate 30 at both sides of the gate electrode 33, thereby forming an MOS transistor. A first interlevel insulating layer 36 and a second interlevel insulating layer 38 are formed at the semiconductor substrate 30 which the MOS transistor is formed thereon. Afterward, the second and the first interlevel insulating layers 38,36 are patterned so that a selected portion of the junction region 35 is exposed, thereby forming a storage node contact hole H. A lower electrode 40 of cylinder type or stack type is formed to be in contacted with the exposed junction region 35. A HSG layer 41 for enlarging the surface area of the lower electrode 40 is formed according to a known method on the surface of the lower electrode 40. Afterwards, the surfaces of the lower electrode 40 and the second interlevel insulating 38 can be cleaned using HF vapor, HF solution, or compounds containing HF to prevent a natural oxide layer having low dielectric constant from generating on the surface of the HSG layer 41, i.e. the interface between the lower electrode 40 including the HSG layer 41 and a dielectric layer(not illustrated) to be formed later. This cleaning-treatment can be performed by a formation process of the lower electrode and by in-situ or ex-situ process. In addition, the surface of the lower electrode 40 can be interface-treated using $NH_4OH$ solution or $H_2SO_4$ solution to improve further the homogeneity of the interface before or after the cleaning-treatment using HF solution. Moreover, as another method, a resultant in which the semiconductor substrate is formed, is thermal-treated under $NH_3$ gas atmosphere at a temperature of 700 to 900° C. in a FTP(fast thermal process) furnace, thereby nitrifying the surface of the lower electrode 40. The generation of a natural oxide layer can be restrained due to the nitrification on the surface of the lower electrode 40. And, as another method, a formation process of the lower electrode and results which the lower electrode 40 is treated in situ by the RTP(rapid thermal process) under a nitrogen atmosphere at a temperature of 600 to 950° C.

Figure 2B:
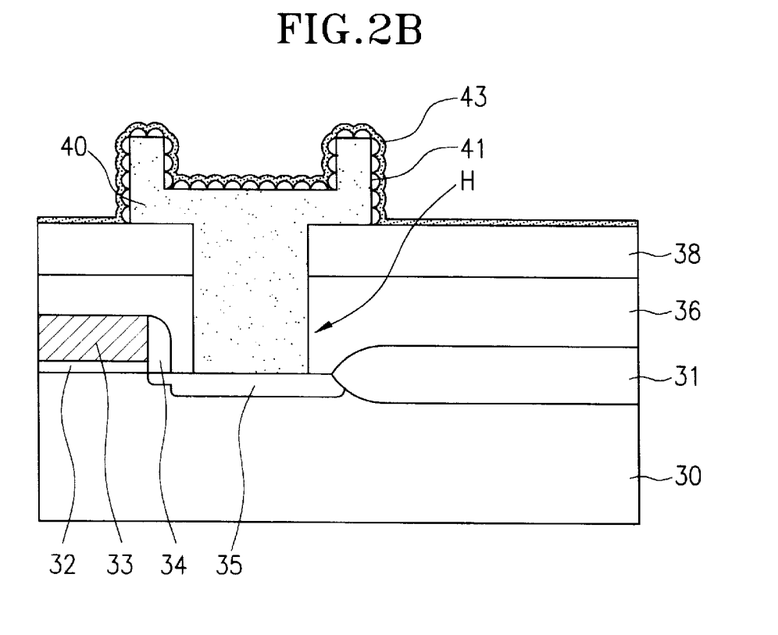
Figure 3:
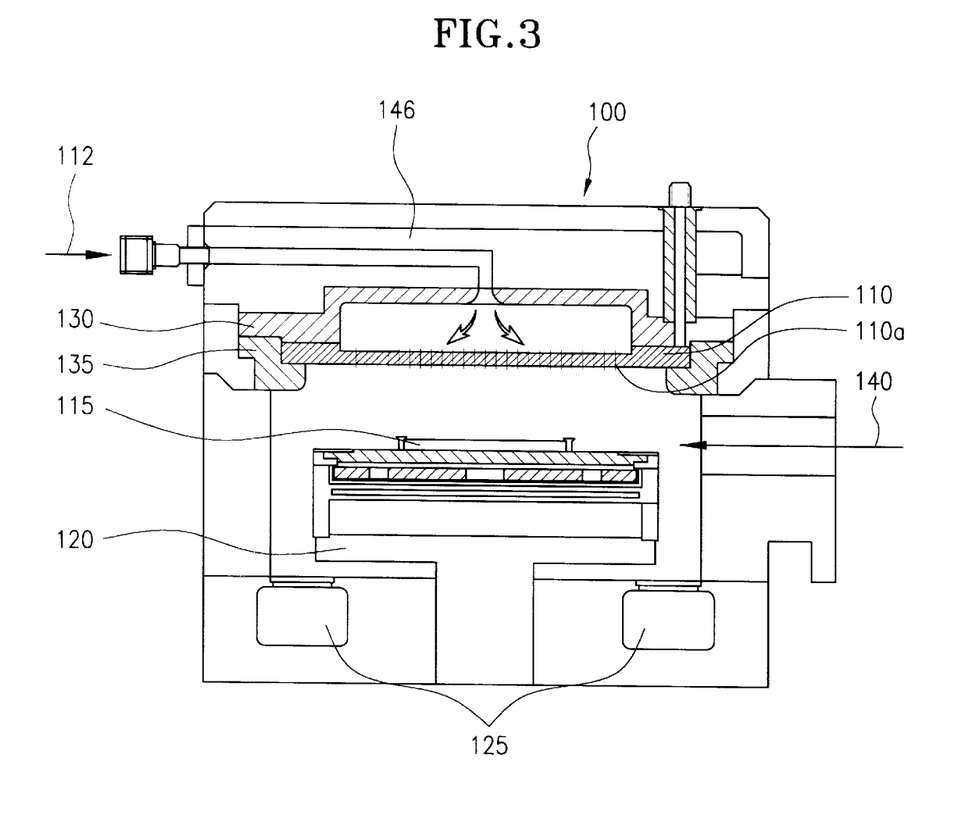
FIG. 3 is a cross-sectional view for illustrating a CVD chamber with a shower head according to a first embodiment of the present invention.

Referring to FIG. 2B, as a dielectric, a TaON layer 43 is formed to the thickness of 50 to 150 Å on a surface of the lower electrode 40 which an amorphous TaON layer 43 is surface-treated thereon. At this time, the amorphous TaON layer 43 can be formed in situ or ex situ. Herein, the amorphous TaON layer 43 is formed by a reaction of Ta chemical vapor, $O_2$ gas and $NH_3$ gas obtained from a precursor in a low temperature chemical vapor deposition (LPCVD) chamber. When depositing the amorphous TaON layer 43, to minimize particle generation therein, a gas phase reaction in a chamber is restrained, a chemical reaction is generated only on a wafer surface, and the temperature inside the LPCVD chamber is preferably maintained at 300 to 600° C. with pressure of 0.1 to 10 Torr. Herein, in case the surface of the lower electrode 40 is cleaned only by HF gas before the formation of the TaON layer, only $NH_3$ gas is first injected into the LPCVD chamber during the deposition of the TaON layer, and then the rest reaction gas is injected after nitrifying the surface of the lower electrode 40 so as to deposit the TaON layer. And, an organic metal substance containing tantalum like $Ta(OC_2H_5)_5$(tantalum ethylate), $Ta(N(CH_3)_2)_5$(penta-dimethyl-amino - tantalum) is used for a precursor. Herein, the precursor such as $Ta(OC_2H_5)_5$, $Ta(N(CH_3)_2)_5$ is, as known, in liquid state and therefore it should be supplied in an LPCVD chamber after converting into vapor state, i.e. Ta chemical vapor. That is, the amount of the precursor in liquid state is fixed by using a flow controller such as MFC(Mass Flow Controller) and then became the Ta chemical vapor after evaporated in an evaporizer including an orifice or a nozzle or a conduit coupled to the chamber. And, the temperature of the evaporizer and a conduit coupled to the chamber that is a flow path of the Ta vapor, is preferably maintained at temperature of 150 to 200° C. so as to prevent condensation of the Ta chemical vapor. At this time, a precursor for making the Ta chemical vapor is supplied in the evaporizer or the conduit coupled to the chamber by 50 to 150 mg/min. The amount of $O_2$ gas depends on that of the Ta chemical vapor while injected into the LPCVD chamber by approximately 5 to 500 sccm and $NH_3$ gas is injected into the LPCVD chamber by approximately 10 to 1000 sccm. Herein, the TaON layer according to the present embodiment, as illustrated in FIG. 3, is formed inside a chemical vapor deposition(CVD) chamber 100 equipped with a shower head 110 on the upper part thereof. At this time, Ta chemical vapor, $O_2$ gas, and $NH_3$ gas are injected into a source inject port 112 and then are injected into a wafer 115(semiconductor substrate) through the hole 110a of the shower head 110. Consequently, reaction gases are injected vertically on the surface of the wafer 115, thereby improving the uniformity of the TaON layer. Herein, an unexplained reference numeral 120 is a supporting rod to which the wafer is laid, and 125 is a vacuum port to make inside of the chamber 100 into vacuum state. And, a reference numeral 130 is an upper isolator made of ceramic interposed between the source inject port 112 and the shower head 110, and 135 is a lower isolator which disposed at both sides of lower ends of the upper isolator 130 and fixing the shower head 110. In addition, a reference numeral 140 is a wafer inject port.

Figure 2C:
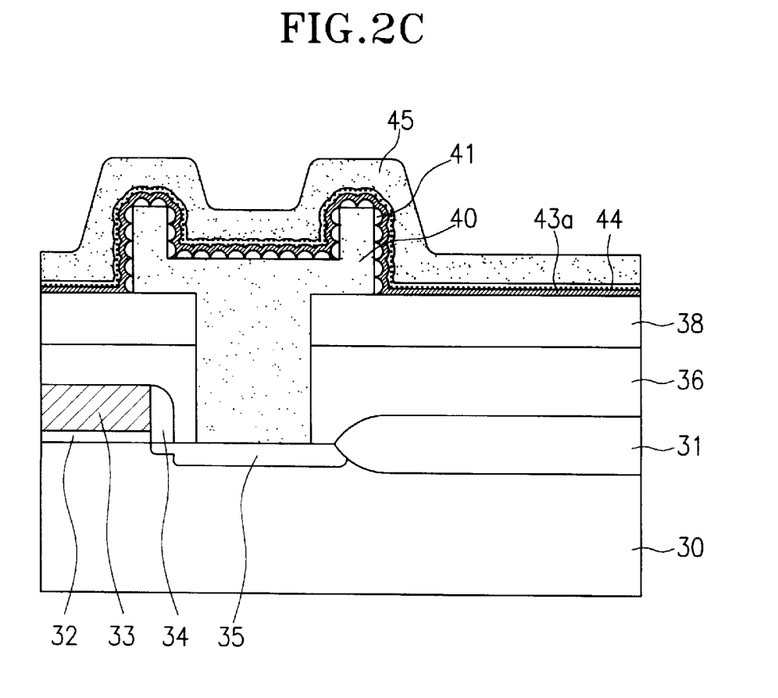

Afterwards, as illustrated in FIG. 2C, the amorphous TaON layer 43 is crystallized by a thermal process so as to obtain more stable state. At this time, the crystallization process is performed as a thermal-treatment in situ or ex situ under atmosphere of $N_2O$ gas, $O_2$ gas, or $N_2$ gas in a chamber or a furnace maintaining a temperature of 600 to 950° C. The amorphous TaON layer 43 is converted into a crystalline TaON layer 43a due to this thermal-treatment and therefore impurities such as carbon compounds remaining inside the amorphous TaON layer 43 are all diffused. Afterwards, a conductive barrier 44 is formed of a TiN layer on the upper part of the crystallized TaON layer 43a. An upper electrode 45 is formed of a doped polysilicon layer.

[Embodiment 2]

An injection method of Ta chemical vapor, $O_2$ gas and $NH_3$ gas according to the present embodiment is different from that of the first embodiment while the other methods are equal to those according to the first embodiment.

Figure 4:
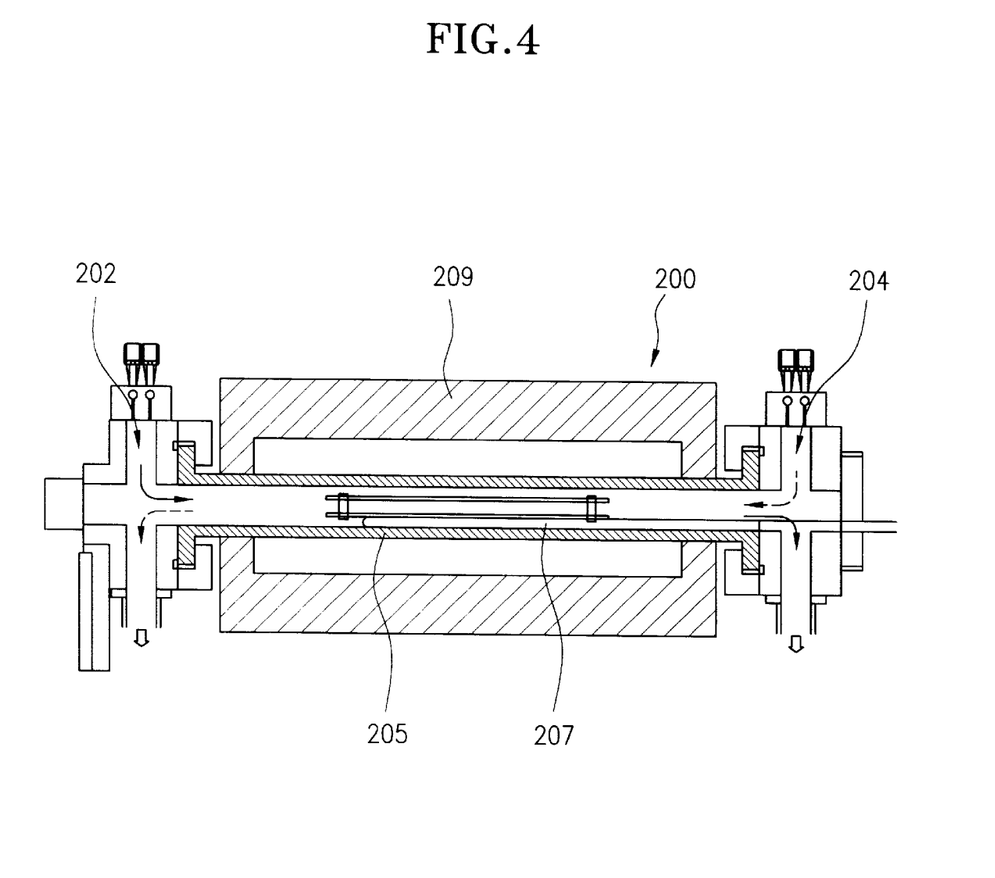
FIG. 4 is a cross-sectional view for illustrating an LPCVD chamber equipped with injectors opposed to each other at both side-walls according to a second embodiment of the present invention.

A TaON layer according to the present embodiment, as illustrated in FIG. 4, is formed inside an LPCVD chamber 200 equipped with injectors opposed to each other at both side-walls. Herein, Ta chemical vapor and $O_2$ gas are injected at one side injector 202 and $NH_3$ gas is injected at the other opposed side injector 204. Like this, the injectors 202, 204 are disposed so as to face each other and therefore Ta chemical vapor, $O_2$ gas and $NH_3$ gas are counter-flowed. Consequently, a gas phase reaction can be restrained and a wafer surface reaction is facilitated. Herein, an unexplained reference numeral 205 is a quartz tube, 207 is a wafer laid inside the quartz tube 205, and 209 is a heating part heating the quartz tube 205.

[Embodiment 3]

An injection method of Ta chemical vapor, $O_2$ gas, and $NH_3$ gas according to the present embodiment is different from those of the first and the second embodiments while the other methods are equal to those according to the first embodiment.

Figure 5:
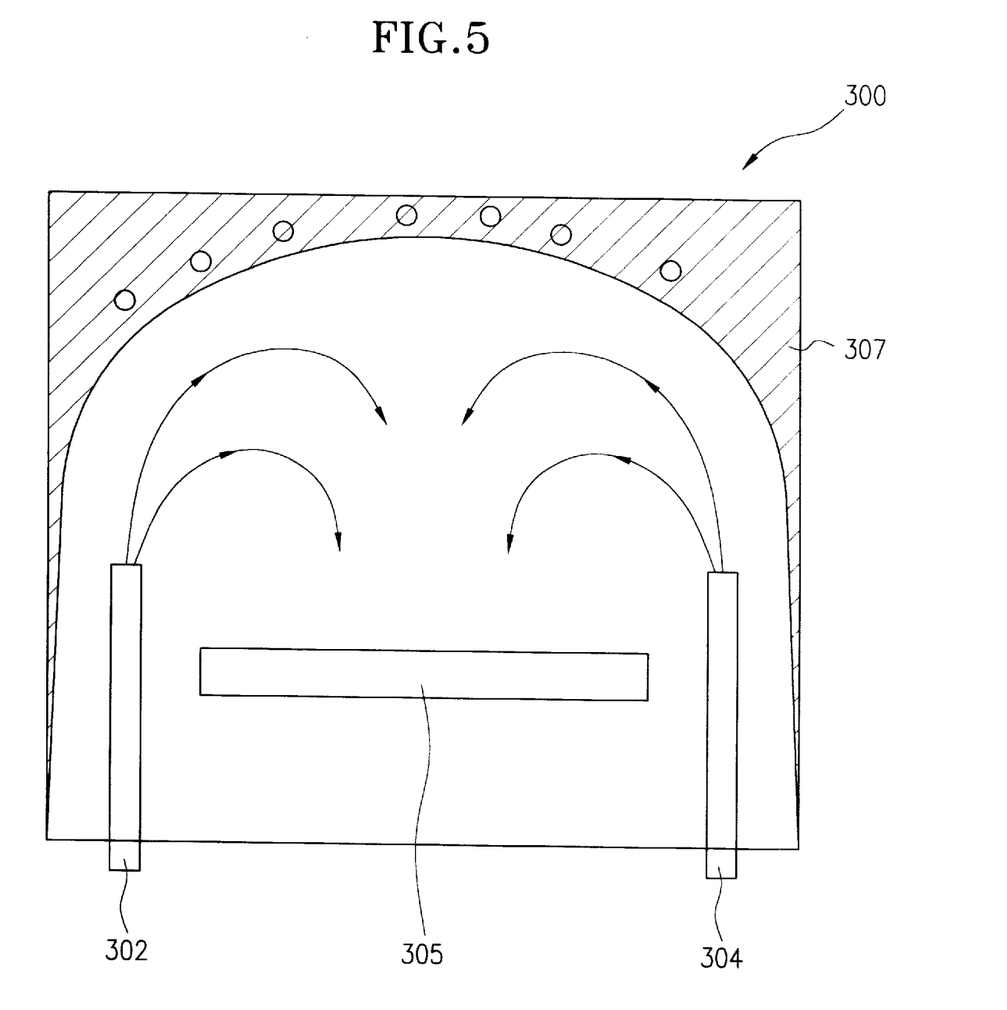
FIG. 5 is a cross-sectional view for illustrating an LPCVD chamber equipped with a pair of injectors at both of lower portion thereof according to a third embodiment of the present invention.

A TaON layer according to the present embodiment, as illustrated in FIG. 5, is formed inside an LPCVD chamber 300 equipped with a pair of injectors 302, 304 at both sides of lower portion thereof. Ta chemical vapor and $O_2$ gas are injected into a chamber in a parabola form at an injector 302 and $NH_3$ gas at the other injector 304. This LPCVD chamber 300 is formed in a dome shape so that the injected gases are injected in a parabola form. Like this, since the injectors are disposed at a lower portion of one side, thereby simplifying the LPCVD structure. Herein, an unexplained reference numeral 307 is a wafer laid inside the LPCVD chamber 300, and 307 is a heating block to heat the chamber 300. Herein, the injectors 302, 304 can obtain an equal effect even in case they are formed side by side at a side-wall.

As described above in detail, since a TaON layer is formed inside an LPCVD chamber equipped with a shower head on the upper part thereof, reaction gases forming the TaON layer are injected through an air hole of the shower head, thereby improving the uniformity of the TaON layer.

And, as a TaON layer is formed inside an LPCVD chamber with the injectors opposed to each other at both side-walls, reaction gases are counter-flowed, thereby restraining a gas phase reaction as well as accelerating a wafer surface reaction.

In addition, as a TaON layer is formed inside an LPCVD chamber with a pair of injectors at both sides thereof, reaction gases are injected into the chamber in a parabola form through the injectors. Consequently, the LPCVD chamber structure can be simplified, thereby reducing manufacturing cost.

And, the TaON layer has a stable bonding structure of Ta—O—N as well as high dielectric constant of 25 to 30. Consequently, the dielectric property of the TaON layer is superior to that of an NO layer and the TaON layer has more stable stoichiometry than that of a tantalum oxide layer. Therefore, the TaON layer has an excellent tolerance against external electric impacts and high breakdown voltage and very low leakage current.

Further, since the substitutional Ta atoms as in the tantalum oxide layer do not exist in the TaON layer, an extra oxidation step may be omitted. Also, the TaON layer has very low oxidation reactivity and therefore hardly oxidizes with either the lower electrode or the upper electrode of the capacitor. Therefore, the thickness of the equivalent dielectric layer can be controlled to less than 30 Å.

Furthermore, all impurities remaining therein are removed by a crystallizing process after the TaON layer is deposited. As a result, the dielectric constant is increased and the leakage current is drastically decreased.

Various other modifications will be apparent to and can be readily made by those skilled in the art without departing from the scope and spirit of the present invention.

What is claimed is:

1. A method of forming a capacitor on a semiconductor substrate comprising the steps of:

forming a lower electrode on a semiconductor substrate;

performing a surface-treatment process to prevent a natural oxide layer from generating on the surface of the lower electrode;

forming a TaON layer on the upper part of the surface-treated lower electrode by a reaction of Ta chemical vapor, $O_2$ gas and $NH_3$ gas;

crystallizing the TaON layer; and forming an upper electrode on the upper part of the TaON layer, wherein the TaON layer is formed in a low pressure chemical vapor deposition(LPCVD) chamber equipped with a shower head injecting Ta chemical vapor, $O_2$ gas and $NH_3$ gas on an upper part thereof and at a temperature of 300 to 600° C. with pressure of 0.1 to 10 Torr.

2. The method according to claim 1, wherein the TaON chemical vapor is obtained by evaporating a quantified precursor in an evaporizer or a conduit coupled to the chamber.

3. The method according to claim 2, wherein the precursor is $Ta(O_2C_2H_5)_5$ or $Ta(N(CH_3)_2)_5$.

4. The method according to claim 3, wherein the precursor is supplied in the evaporizer or the conduit coupled to the chamber by 50 to 150 mg/min.

5. The method according to claim 4, wherein the $O_2$ gas is injected into an LPCVD chamber by approximately 5 to 500 sccm and NH$_3$ gas is injected into the LPCVD chamber by 10 to 100 sccm.

6. The method according to claim 1, wherein in the step of surface-treating the lower electrode, the surface of the lower electrode is cleaned by using a compound containing HF.

7. The method according to claim 6, wherein before or after the cleaning step using the compound containing HF, the surface of the lower electrode is additionally interface-treated by using NH$_4$OH solution or H$_2$SO$_4$ solution to improve further the uniformity of the interface.

8. The method according to claim 6, wherein after the cleaning step using a compound containing, when forming a TaON layer, NH$_3$ gas is first supplied, thereby nitrifying the surface of the lower electrode.

9. The method according to claim 1, wherein in the surface-treating step of the lower electrode, a resultant of a semiconductor substrate in which a lower electrode is formed, is thermal-treated under an NH$_3$ gas atmosphere at a temperature of 700 to 900° C. in an FTP(fast thermal process) furnace.

10. The method according to claim 1, wherein in the surface-treating step of the lower electrode, the resultant in which the lower electrode is formed, is treated by an RTP(rapid thermal process) under a nitrogen atmosphere at a temperature of 600 to 950° C.

11. The method according to claim 1, wherein the crystallizing process is thermal-treated under an atmosphere of N$_2$O gas, O$_2$ gas, or N$_2$ gas in a chamber maintaining a temperature of 600 to 950° C.

12. The method according to claim 1, wherein the crystallizing process is thermal-treated under an atmosphere of N$_2$O gas, O$_2$ gas or N$_2$ gas in a furnace maintaining a temperature of 600 to 950° C.

13. A method of forming a capacitor on a semiconductor substrate comprising the steps of:

forming a lower electrode on the semiconductor substrate;

performing a surface-treatment process to prevent a natural oxide layer from generating on the surface of the lower electrode;

forming a TaON layer on the upper part of the surface-treated lower electrode by a reaction of Ta chemical vapor, O$_2$ gas and NH$_3$ gas;

crystallizing the TaON layer; and forming an upper electrode on the upper part of the TaON layer, wherein the TaON layer is formed in an LPCVD chamber that a first injector to which Ta chemical vapor and O$_2$ gas are injected and formed at one side-wall of the chamber and a second injector to which NH$_3$ gas is injected and formed at the other side-wall opposed to the first injector, thereby injecting reaction gases in a counter-flow state, and the TaON layer is formed at a temperature of 300 to 600° C. with pressure of 0.1 to 10 Torr.

14. The method according to claim 13, wherein the Ta chemical vapor is obtained by evaporating a quantified precursor in a evaporizer or a conduit coupled to the chamber.

15. The method according to claim 14, wherein the precursor is Ta(O$_2$C$_2$H$_5$)$_5$ or Ta(N(CH$_3$)$_2$)$_5$.

16. The method according to claim 15, wherein the precursor is supplied in the evaporizer or the conduit coupled to the chamber by 50 to 150 mg/min.

17. The method according to claim 16, wherein the O$_2$ gas is injected into an LPCVD chamber by approximately 5 to 500 sccm and the NH$_3$ gas is injected into the LPCVD chamber by approximately 10 to 1000 sccm or so.

18. The method according to claim 13, wherein in the surface-treating step of the lower electrode, the surface of the lower electrode is cleaned by using a compound containing HF.

19. The method according to claim 18, wherein before or after the cleaning step using the compound containing HF, the surface of the lower electrode is additionally interface-treated using NH$_4$OH solution or H$_2$SO$_4$ solution to improve further the uniformity of the interface.

20. The method according to claim 18, wherein after the cleaning step using the compound containing HF, when forming the TaON layer, NH$_2$ gas is first supplied, thereby nitrifying the surface of the lower electrode.

21. The method according to claim 13, wherein in the surface-treating step of the lower electrode, a resultant of a semiconductor substrate in which a lower electrode is formed, is thermal-treated under an NH$_3$ gas atmosphere at a temperature of 700 to 900° C. in a FTP furnace.

22. The method according to claim 13, wherein in the surface-treating step of the lower electrode, the resultant in which the lower electrode is formed, is treated by an RTP under a nitrogen atmosphere at a temperature of 600 to 950° C.

23. The method according to claim 13, wherein the crystallizing process is thermal-treated under an atmosphere of N$_2$O gas, O$_2$ gas, or N$_2$ gas in a chamber maintaining a temperature of 600 to 950° C.

24. The method according to claim 13, wherein the crystallizing process is thermal-treated under an atmosphere of N$_2$O gas, O$_2$ gas or N$_2$ gas in a furnace maintaining a temperature of 600 to 950° C.

25. A method of manufacturing a capacitor for a semiconductor memory device comprising the steps of:

forming a lower electrode on the semiconductor substrate;

performing a surface-treatment process to prevent a natural oxide layer from generating on the surface of the lower electrode;

forming a TaON layer on the upper part of the surface-treated lower electrode by a reaction of Ta chemical vapor, O$_2$ gas and NH$_3$ gas;

crystallizing the TaON layer; and forming an upper electrode on the upper part of the TaON layer, wherein the TaON layer is formed in an LPCVD chamber by providing a first injector injecting Ta chemical vapor and O$_2$ gas and a second injector injecting NH$_3$ gas at both sides of lower portion thereof respectively, thereby injecting the reaction gases in a parabola form, and the TaON layer is formed at a temperature of 300 to 600° C. with pressure of 0.1 to 10 Torr.

26. The method according to claim 25, wherein the Ta chemical vapor is obtained by evaporating a quantified precursor in an evaporizer or a conduit coupled to the chamber.

27. The method according to claim 26, wherein the precursor is Ta(O$_2$C$_2$H$_5$)$_5$ or Ta(N(CH$_3$)$_2$)$_5$.

28. The method according to claim 27, wherein the precursor is supplied in an evaporizer or a conduit coupled to the chamber by 50 to 150 mg/min.

29. The method according to claim 28, wherein the O$_2$ gas is injected into an LPCVD chamber by approximately 5 to 500 sccm and the NH$_3$ gas is injected into the LPCVD chamber by approximately 10 to 1000 sccm.

30. The method according to claim 25, wherein in the surface-treating step of the lower electrode, the surface of the lower electrode is cleaned by using the compound containing HF.

31. The method according to claim 30, wherein before or after the cleaning step by using the compound containing HF, the surface of the lower electrode is additionally interface-treated using $NH_4OH$ solution or $H_2SO_4$ solution to improve further the uniformity of the interface.

32. The method according to claim 30, wherein after the cleaning step using the compound containing HF, when forming the TaON layer, $NH_3$ gas is first supplied, thereby nitrifying the surface of the lower electrode.

33. The method according to claim 25, wherein in the surface-treating step of the lower electrode, a resultant of a semiconductor substrate in which a lower electrode is formed, is thermal-treated under an $NH_3$ gas atmosphere at a temperature of 700 to 900° C. in an FTP furnace.

34. The method according to claim 25, wherein in the surface-treating step of the lower electrode, the resultant in which the lower electrode is formed, is treated by an RTP under a nitrogen atmosphere at a temperature of 600 to 950° C.

35. The method according to claim 25, wherein the crystallizing process is thermal-treated under an atmosphere of $N_2O$ gas, $O_2$ gas, or $N_2$ gas in a chamber maintaining a temperature of 600 to 950° C.

36. The method according to claim 25, wherein the crystallizing process is thermal-treated under an atmosphere of $N_2O$ gas, $O_2$ gas or $N_2$ gas in a furnace maintaining a temperature of 600 to 950° C.

* * * * *